United States Patent
LaPalme et al.

(10) Patent No.: US 9,554,485 B2
(45) Date of Patent: Jan. 24, 2017

(54) APPARATUS, SYSTEMS AND METHODS FOR LIMITING TRAVEL DISTANCE OF A HEAT SINK

(71) Applicant: EchoStar Technologies L.L.C., Englewood, CO (US)

(72) Inventors: Jerome A. LaPalme, Aurora, CO (US); William T. Roberts, Centennial, CO (US)

(73) Assignee: EchoStar Technologies L.L.C., Englewood, CO (US)

( * ) Notice: Subject to any disclaimer, the term of this patent is extended or adjusted under 35 U.S.C. 154(b) by 150 days.

(21) Appl. No.: 14/446,138

(22) Filed: Jul. 29, 2014

(65) Prior Publication Data

US 2016/0035642 A1    Feb. 4, 2016

(51) Int. Cl.
| H05K 7/20 | (2006.01) |
| H01L 23/40 | (2006.01) |
| H01L 23/367 | (2006.01) |
| H01L 23/00 | (2006.01) |

(52) U.S. Cl.
CPC ............ *H05K 7/20* (2013.01); *H01L 23/367* (2013.01); *H01L 23/4093* (2013.01); *H01L 24/13* (2013.01); *H01L 24/16* (2013.01); *H01L 24/32* (2013.01); *H01L 24/73* (2013.01); *H01L 24/92* (2013.01); *H01L 2224/131* (2013.01); *H01L 2224/16227* (2013.01); *H01L 2224/32225* (2013.01); *H01L 2224/73204* (2013.01); *H01L 2224/92125* (2013.01); *H01L 2924/14* (2013.01); *H01L 2924/15311* (2013.01); *H01L 2924/3512* (2013.01)

(58) Field of Classification Search
None
See application file for complete search history.

(56) References Cited

U.S. PATENT DOCUMENTS

| 5,533,256 | A | 7/1996 | Call et al. |
| 5,548,482 | A | 8/1996 | Hatauchi et al. |
| 6,008,991 | A | 12/1999 | Hawthorne et al. |
| 6,061,240 | A | 5/2000 | Butterbaugh et al. |
| 6,205,026 | B1 | 3/2001 | Wong et al. |
| 6,317,328 | B1 * | 11/2001 | Su ................. H01L 23/4006 165/80.3 |
| 6,331,937 | B1 * | 12/2001 | Bartyzel ........... H01L 23/4093 257/718 |
| 6,643,137 | B1 * | 11/2003 | Chung ............... H01L 23/367 165/185 |
| 6,707,674 | B1 | 3/2004 | Bryant et al. |

(Continued)

*Primary Examiner* — Courtney Smith
*Assistant Examiner* — Zhengfu Feng
(74) *Attorney, Agent, or Firm* — Lowe Graham Jones PLLC

(57) ABSTRACT

A heat sink embodiment has at least one anti-rocking tab that extends outwardly and downwardly from an edge of the body portion of the heat sink. A leading lower edge of the anti-rocking tab is above a top surface of the motherboard when the heat sink is being affixed to the motherboard over a flip chip. During installation of the heat sink to the motherboard, a travel distance limit is imposed by the leading lower edge of the anti-rocking tab, thereby limiting a force that is applied to the die of the flip chip so that an edge and/or a corner of the die of the flip chip is not crushed, or such that the die of the flip chip is not cracked.

20 Claims, 7 Drawing Sheets

(56) References Cited

U.S. PATENT DOCUMENTS

| | | | |
|---|---|---|---|
| 7,164,587 B1* | 1/2007 | Garnett | H01L 23/36 |
| | | | 174/350 |
| 7,272,009 B2 | 9/2007 | Sura et al. | |
| 7,869,217 B2* | 1/2011 | Chen | H01L 23/4093 |
| | | | 165/80.2 |
| 2008/0158827 A1* | 7/2008 | Yang | H01L 23/4093 |
| | | | 361/719 |
| 2008/0310119 A1 | 12/2008 | Giacoma | |

* cited by examiner

APPARATUS, SYSTEMS AND METHODS FOR LIMITING TRAVEL DISTANCE OF A HEAT SINK

BACKGROUND

Electronic devices are available to perform a variety of functions. Generally, the electronic devices have a plurality of electronic components therein that are physically attached to, or mounted on, a structure referred to as a "motherboard" or a "circuit board." During assembly, the motherboard is secured within a protective housing, chassis or the like. Depending upon the nature of the electronic device, various user interface devices (buttons, knobs, switches, displays or the like) and connection interfaces to other electronic devices are disposed on the outside surfaces of the protective housing, chassis or the like.

One commonly encountered electronic component is the Integrated Circuit (IC). The IC has a die therein which is an electronic chip comprising a plurality of semiconductor elements therein which form one or more electronic circuits. Typically, many dies are fabricated onto a relatively large silicon wafer. Individual dies are then cut (diced) away from the silicon wafer, and are then individually packaged onto a carrier structure to form an IC. The carrier structure of the ICs includes a plurality of electrical connectors that provide electrical connectivity between the electronic circuits of the die and connectors on the motherboard, thereby providing a means for electrical connectivity to other electronic components also attached to the motherboard. The IC may be attached to the motherboard in a variety of manners, such as by using solder type connections or push pin connectors.

Of particular interest to the electronic industry is a particular type of IC known as a "flip chip" IC package, or the flip chip. The flip chip is based on a fabrication process wherein during fabrication of the die on the silicon wafer, one or more electrical contacts are directly fabricated into the silicon wafer material. These electrical contacts provide an electrical connection from a formed semiconductor electronic circuit of the die to the outside surface of the die (which is typically to the top surface of the dies formed on the silicon wafer). Once formed, small solder bumps, solder balls or the like are affixed to the surface of the die at each of the electrical contacts that are exposed on the top of the die surface.

Then, the die is "flipped" over and placed onto a carrier structure with electrical connectors fabricated therein. When placed upside down on the carrier structure, the solder bumps, balls or the like are aligned with and are in contact with corresponding electrical connectors of the carrier structure. When a soldering process is performed, the upside down die becomes secured to the carrier structure. Then, an underfill material that fills in the areas under the die between the carrier and the solder bumps, balls or the like is applied. Accordingly, the carrier structure and underfill material provides physical protection and support to the relatively fragile die. The carrier structure facilitates attachment to the motherboard since the carrier structure electrical connectors are readily accessible for connecting to the corresponding electrical connectors of the motherboard. This upside down die attached to the carrier substrate is referred to as a flip chip.

Some types of ICs, during operation, generate undesirable levels of heat which must be transferred away from the IC to prevent damage to the IC and/or to other nearby electronic components. A heat absorbing and dissipating structure, referred to herein as a heat sink, may be placed in thermal contact with the heat-generating IC. The heat generated by the IC is absorbed by the heat sink, is thermally conducted away from the IC and to another portion of the heat sink, and then is dissipated out from the heat sink as thermal energy. Such heat sinks are typically added after the IC has been attached to the motherboard.

FIG. 1 is a perspective view 100 of a legacy heat sink 102 being affixed over a flip chip 104 that is secured to a motherboard 106. The flip chip includes the carrier structure 108, the upside down die 110, and the underfill 112. The legacy heat sink 102 is secured to the motherboard 106 using a plurality of suitable fasteners, such as the example push pin connector assemblies 114. Each example push pin connector assembly 114 includes a head 116, a retainer pin 118, a lock tab structure 120, and a coiled spring 122.

The legacy heat sink 102 is affixed to the motherboard 106 by a person or machine. The lock tab structure 120 of each of the push pin connector assemblies 114 is aligned with a corresponding bore 124 (a hole) that extends through a top surface 126 to a bottom surface 128 of the motherboard 106. When the lock tab structure 120 is aligned with the respective bore 124, a downward force is exerted on the heads 116 of the push pin connector assemblies 114, thereby moving the lock tab structure 120 through the respective bore 124. When the lock tab structure 120 has passed through the bore 124, the lock tab structure 120 engages the bottom surface 128 of the motherboard 106 so as to become non-retractable, and thereby affixing the legacy heat sink 102 to the motherboard 106. The coiled spring 122, which has been compressed while the lock tab structure 120 is passing through the bore 124, maintains a force or pressure so that the bottom surface of the legacy heat sink 102 remains in thermal contact with the top of the flip chip 104. Thus, heat generated by the operating flip chip 104 can be absorbed and dissipated by the legacy heat sink 102.

FIG. 1 further illustrates a problem often encountered when a legacy heat sink 102 is affixed to the motherboard 106. The problem arises when the lock tab structure 120 of a plurality of push pin connector assemblies 114 are not evenly pushed through their respective bores 124 of the motherboard 106. That is, and as illustrated in FIG. 1, the legacy heat sink 102 may be at some point be disposed at an angle $\theta_1$ relative to the orientation of the motherboard 106.

As illustrated in FIG. 1, when the legacy heat sink 102 is affixed to the motherboard 106 at an example angle $\theta_1$ (illustrated as being approximately 15°), the bottom surface of the legacy heat sink 102 will be in contact with an edge of the top surface of the die 110 of the flip chip 104. In such situations, an undesirable amount of force and/or pressure may be applied to this edge of the die 110. Such applied force or pressure may be sufficient to cause damage to the relatively fragile die 110. For example, the edge and/or a corner of the top surface of the die 110 may become crushed, and/or a crack may be caused through the die 110. If sufficient damage occurs to the die 110, the die 110 may become inoperable.

Accordingly, there is a need in the arts to provide a system and method for limiting the travel distance, and hence the angle, of a heat sink when the heat sink is affixed to the motherboard 106 over the flip chip 104.

SUMMARY

A heat sink embodiment has at least one anti-rocking tab that extends outwardly and downwardly from an edge of the body portion of the heat sink. A leading lower edge of the anti-rocking tab is above a top surface of the motherboard when the heat sink is being affixed to the motherboard over a flip chip. During installation of the heat sink to the motherboard, a travel distance limit is imposed by the leading lower edge of the anti-rocking tab, thereby limiting a force that is applied to the die of the flip chip so that an edge and/or a corner of the die of the flip chip is not crushed, or such that the die of the flip chip is not cracked.

BRIEF DESCRIPTION OF THE DRAWINGS

Preferred and alternative embodiments are described in detail below with reference to the following drawings.

DETAILED DESCRIPTION

Figure 1:
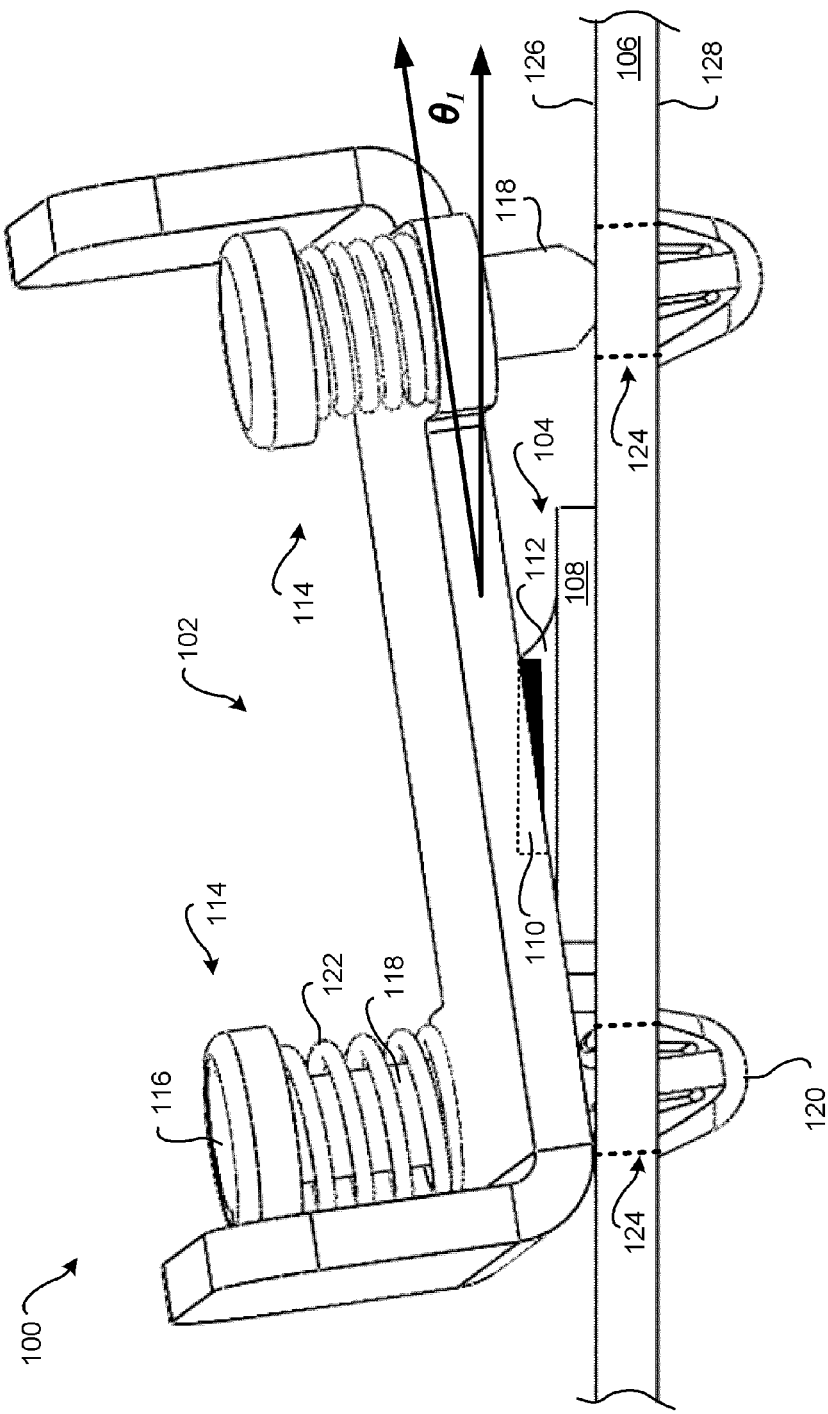
FIG. 1 is a perspective view of a legacy heat sink being affixed over a flip chip that is secured to a motherboard.
Figure 2:
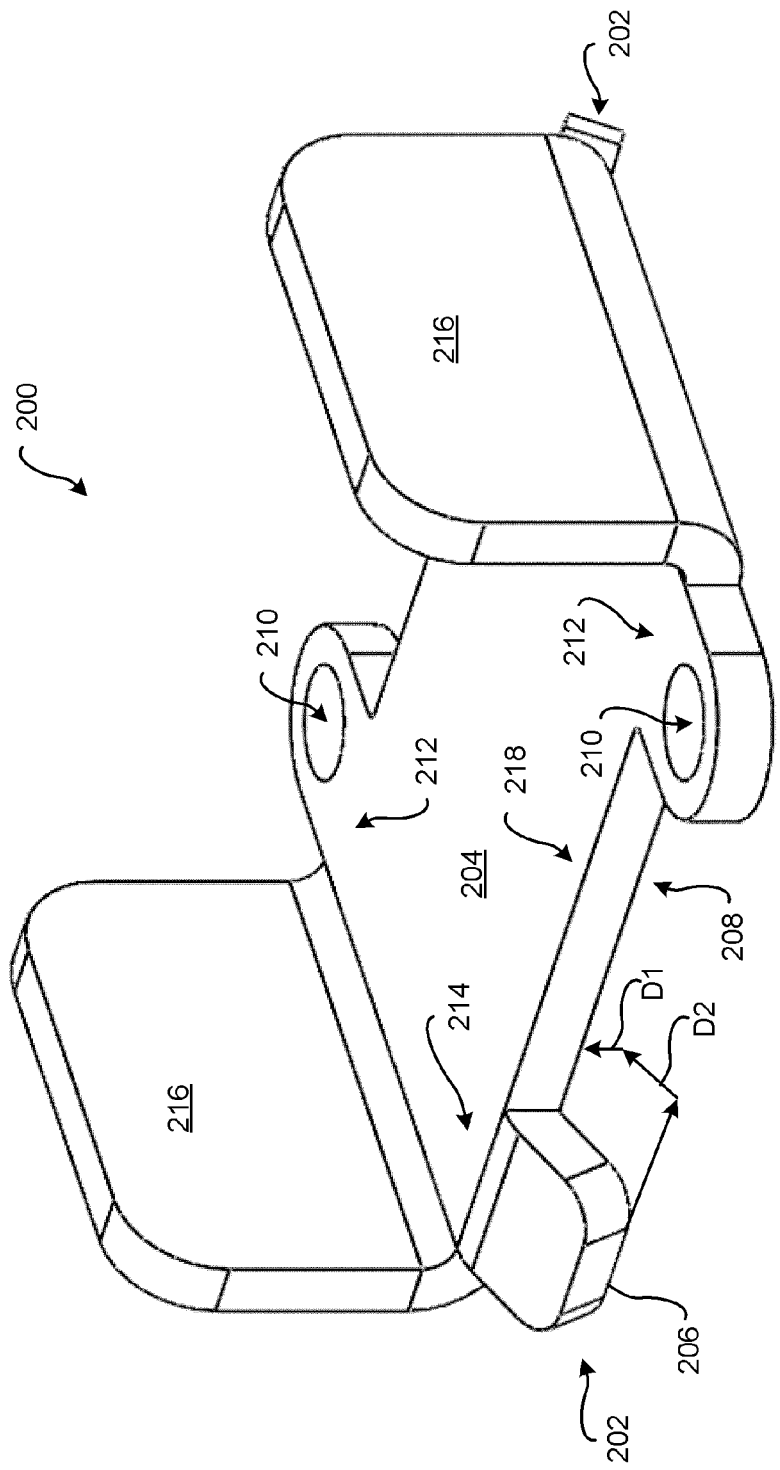
FIG. 2 is a perspective view of a heat sink.

FIG. 2 is a perspective view of a travel distance limited heat sink 200. The exemplary travel distance limited heat sink 200, interchangeably referred to herein as the heat sink 200, comprises a plurality of anti-rocking tabs 202 extending outwardly and downwardly from a body portion 204 of the heat sink 200. A leading lower edge 206 of each anti-rocking tab 202 extends downward below the bottom surface 208 of the body portion 204 by a distance D1. The anti-rocking tab 202 reduces the travel distance that the heat sink 200 may travel when being affixed to the motherboard 106 (FIG. 1). By limiting the possible travel distance of the body portion 204 of the heat sink 200, any forces and/or pressures exerted by the bottom surface 208 of the body portion 204 on a top surface of a flip chip (not shown) may be limited in the event that the heat sink 200 is being affixed to the motherboard 106 while at an angle (with respect to the motherboard 106). That is, if the heat sink 200 is not horizontally oriented with respect to the motherboard 106 as it is being affixed to the motherboard 106, the maximum angle of the heat sink 200 will be limited by the anti-rocking tab 202 so as to limit the force and/or pressure exerted on an edge of the die 110 of the flip chip 104.

The example travel distance limited heat sink 200 is defined by a body portion 204 that extends beyond the edges of the flip chip (not shown). The example body portion 204 includes two bores 210 (holes or apertures) extending there through. The two bores 210 are configured to receive a suitable fastener to facilitate the securing of the heat sink 200 to the motherboard 106. In other embodiments, any number of bores 210 may be used to receive a suitable fastener. In the example embodiment, the bores 210 are located at opposing corners 212 of the body portion 204

The example travel distance limited heat sink 200 includes two anti-rocking tabs 202 located at opposing corners 214 of the body portion 204. In the example embodiment illustrated in FIG. 2, a first bore 210 is located in proximity to a first corner of the body portion 204, a first anti-rocking tab 202 is located in proximity to a second corner adjacent to the first corner, a second bore 210 is located in proximity to a third corner that opposes the location of the first corner, and a second anti-rocking tab 202 is located in proximity to a fourth corner that opposes the second corner.

In other embodiments, any number of anti-rocking tabs 202 may be used to limit one or more the travel distances of the heat sink 200 when being affixed to the motherboard 106. Further, the anti-rocking tabs 202 may be secured to any suitable location on the body portion 204.

Some embodiments of the heat sink 200 may include optional heat radiating fins 216. The heat radiating fins 216 are configured to receive heat conducted from the body portion 204, and then radiate (dissipate) the received heat to the environment surrounding the heat radiating fins 216, which is typically air. Alternative embodiments of heat sink 200 may omit heat radiating fins 216, or may include other numbers of heat radiating fins 216. Other embodiments may have other structures configured to receive heat from the body portion 204 and to then radiate the received heat to the environment.

The body portion 204 is further defined by a top surface 218. Portions of the top surface about the bores 210 hold the suitable fasteners in place when the heat sink 200 has been affixed to the motherboard 106. Further, heat may also be radiated (dissipated) from the top surface 218 to the environment.

Various embodiments of the heat sink 200 may be made of suitable thermally conductive material. In an example embodiment, the heat sink 200 is made of aluminum.

Embodiments of the heat sink 200 may be fabricated using any suitable process. The example heat sink 200 of FIG. 2 is appreciated by one skilled in the arts to have been formed from a sheet metal material. Here, a die and/or press process initially cuts the heat sink 200 from a sheet of metal. The heat radiating fins 216 are bent upwards to a desired angle with respect to the top surface 218, here illustrated as being approximately 90°.

The bores 210 may be drilled through the formed heat sink 200. Alternatively, the bores 210 may be formed in other manners. In the example embodiment, the bores 210 are formed in protruding portions of the body portion 204 of the heat sink 200. Alternatively, the bores 210 may be formed elsewhere on the body portion 204.

In the example embodiment of the heat sink 200 illustrated in FIG. 2, the anti-rocking tab 202 is a portion that extends outwardly from the body portion 204. The anti-rocking tab 202 is bent in a downward direction so that the leading lower edge 206 of the anti-rocking tab 202 is disposed below the bottom surface 208 of the body portion 204. The length that the anti-rocking tab 202 extends outwardly from the body portion 204 and the desired angle of the bending of the anti-rocking tab 202 may be selected so that the distances D1 and D2 defining the location of the lower edge 206 below the bottom surface 208 is at a desired location that limits the travel distance of the heat sink 200 when it is affixed to the motherboard 106. Further, the distance D1 must not be so long as to interfere with the operation of the selected fasteners that are used to affix the heat sink 200 to the motherboard 106. On the other hand, the distance D1 must be long enough so as to limit the travel distance of the heat sink 200 so as to reduce the force or pressure exerted on the top surface edge of the flip chip when the heat sink 200 is affixed to the motherboard 106. The distance D2 must be sufficiently long so as to avoid contact between the anti-rocking tab 202 and the flip chip, and/or other electronic components that are in proximity to the anti-rocking tab 202.

Other fabrication processes may be used to form alternative embodiments of the heat sink 200. For example, an extrusion process may be used wherein the profile of the heat sink 200 is defined by the shape and configuration of an extrusion die. Thus, one or more heat radiating fins 216 may be disposed on the top surface 218 of the body portion 204 at any desired angle.

Another example fabrication process may be casting. Here, a cast may be designed such that the heat radiating fins 216, the anti-rocking tab 202, and/or the bores 210 are formed as desired during the casting process. Accordingly, when released from the casting form, the heat sink 200 may be in its final form, or may at least require fewer bending operations to bend the heat radiating fins 216 and/or the anti-rocking tab 202 in their desired orientations.

Figure 3:
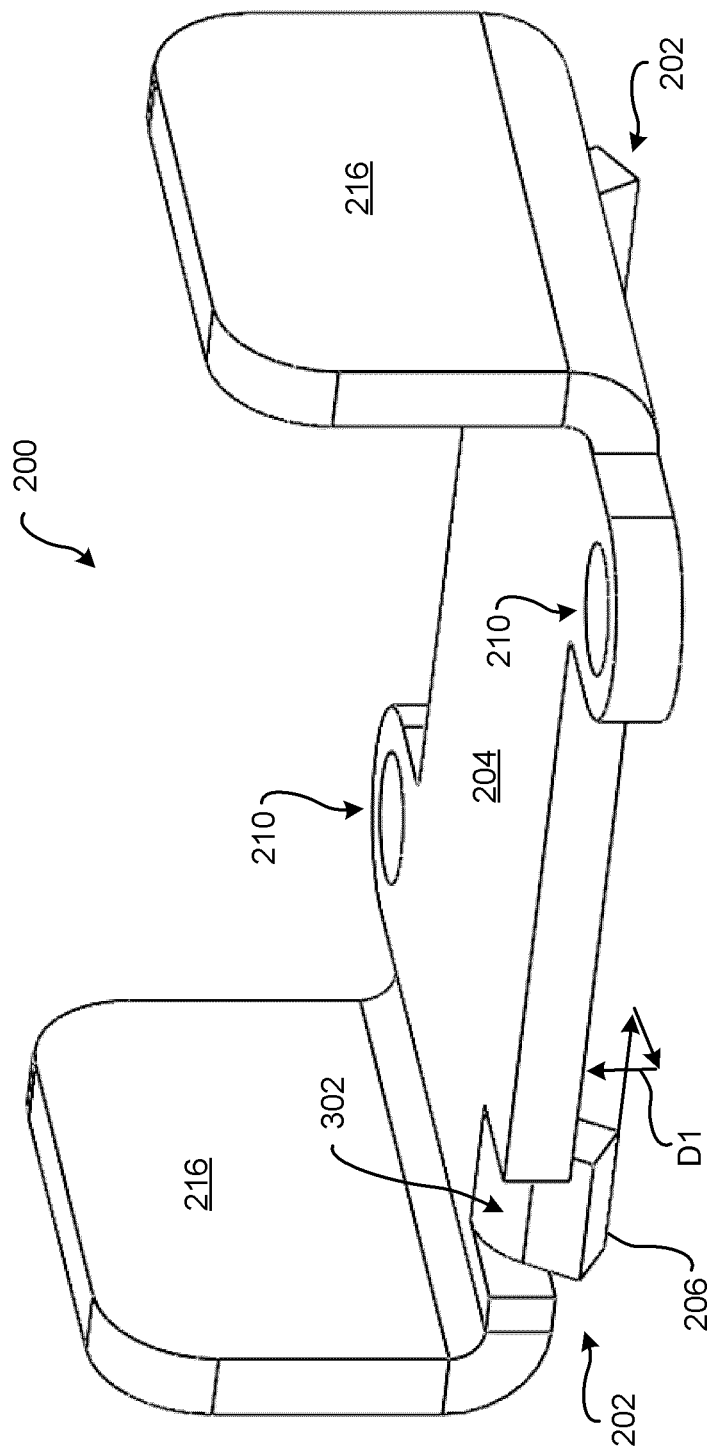
FIG. 3 is a perspective view of an alternative embodiment of the heat sink.

FIG. 3 is a perspective view of an alternative embodiment of the heat sink 200. Here, one skilled in the art appreciates that the anti-rocking tab 202 has been formed from a portion 302 of the body portion 204 using a cut and bend process. Such an embodiment may be desirable when the heat sink 200 is formed from sheet metal using a suitable die and mold that forcibly cuts a portion of the sheet metal into the shape of the heat sink 200 and bends the anti-rocking tab 202 and/or the heat radiating fins 216. Alternatively, after the form of the heat sink 200 has been made from sheet metal, or has been made by casting, a cut and bend process may be used to form and bend the anti-rocking tab 202 as desired. Such an embodiment may be desirable in applications where a plurality of similarly shaped heat sinks 200 are used, but where different travel distances D1 and/or D2 are desired for different flip chips and/or when different shapes, styles, and/or sizes of the anti-rocking tabs 202 are used. Thus, a different cut and/or bend may be used to define different anti-rocking tabs 202.

Figure 4:
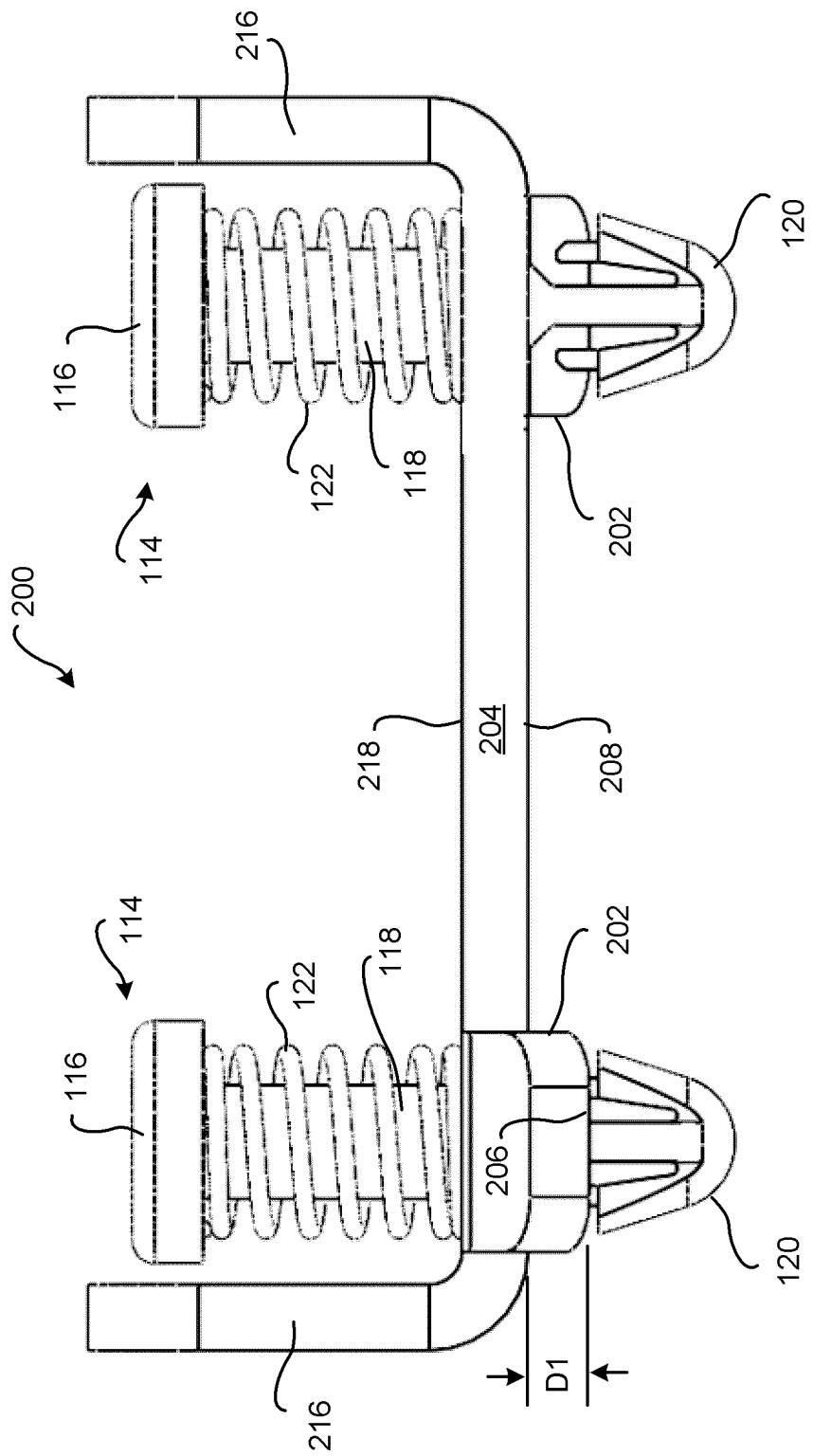
FIG. 4 is a side view of an edge of an embodiment of the heat sink.

FIG. 4 is a side view of an edge of an embodiment of the heat sink 200. The distance D1 associated with the lower edge 206 of the anti-rocking tab 202 is illustrated. Two push pin connector assemblies 114 (that each include a head 116, a retainer pin 118, a lock tab structure 120, and a coiled spring 122) have been pre-inserted through the heat sink bores 210 (FIGS. 2 and 3). Accordingly, one skilled in the art appreciates that the pre-assembled heat sink 200 with push pin connector assemblies 114 is now ready to affix to the motherboard 106.

Figure 5:
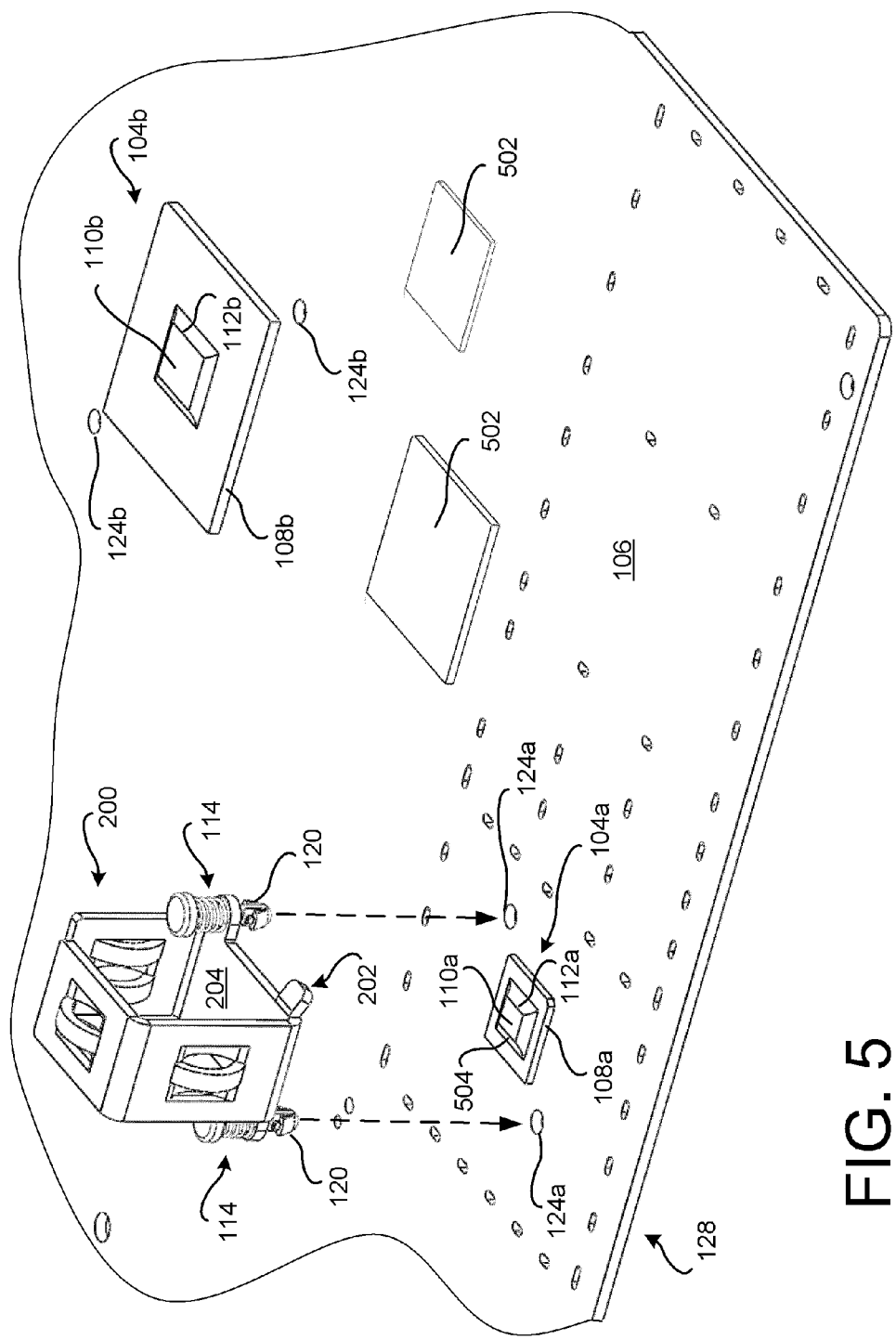
FIG. 5 is a perspective view of a portion of a motherboard having two flip chips and a plurality of electronic components mounted thereon, with an example embodiment of a heat sink 200 being oriented over the second flip chip.

FIG. 5 is a perspective view of a portion of a motherboard 106 having two flip chips 104a, 104b and a plurality of electronic components 502 mounted thereon. The example embodiment of the travel distance limited heat sink 200 is oriented over the flip chip 104a. This exemplary heat sink 200 includes a basket or cage type of heat dissipating element above the base portion 204.

Here, one skilled in the arts appreciates that a person or a machine is ready to affix the illustrated heat sink 200 to the motherboard 106 in a location that is on top of the flip chip 104a. The flip chip 104a includes a carrier structure 108a, a die 110a, and underfill 112a. A second flip chip 104b is also illustrated. The flip chip 104b includes a carrier structure 108b, a die 110b, and underfill 112b. A second heat sink (not shown) would be affixed to the motherboard 106 by inserting its push pin connector assemblies through the bores 124b.

Here, the push pin connector assemblies 114 are oriented over and are aligned with the bores 124a in the motherboard 106. The heat sink 200 is moved downward until the lock tab structures 120 are pushed through the motherboard bores 124a so as to engage the bottom surface 128 of the motherboard 106, thereby affixing the heat sink 200 to the motherboard 106.

In the event that the heat sink 200 is not horizontally oriented with respect to the motherboard 106 as it is being affixed to the motherboard 106, the maximum angle of the heat sink 200 will be limited by the anti-rocking tab 202 so as to limit the force and/or pressure exerted on an edge 504 of the top surface of the die 110a of the flip chip 104a.

Embodiments of the travel distance limited heat sink 200 are equally adaptable for affixing to the motherboard 106 over other types of electronic devices, such as the illustrated electronic components 502. A non-limiting example of the electronic components 502 are other types of integrated chips (IC) that have been fabricated using non-flip chip formats. Alternatively, or additionally, the travel distance limited heat sink 200 may be affixed to the motherboard 106 over electronic devices have a plurality of components. Further, one or more of the anti-rocking tabs 202 may be configured so that no parts of the heat sink 202 come into contact with a selected component when the heat sink 202 is being affixed to the motherboard 106.

Figure 6:
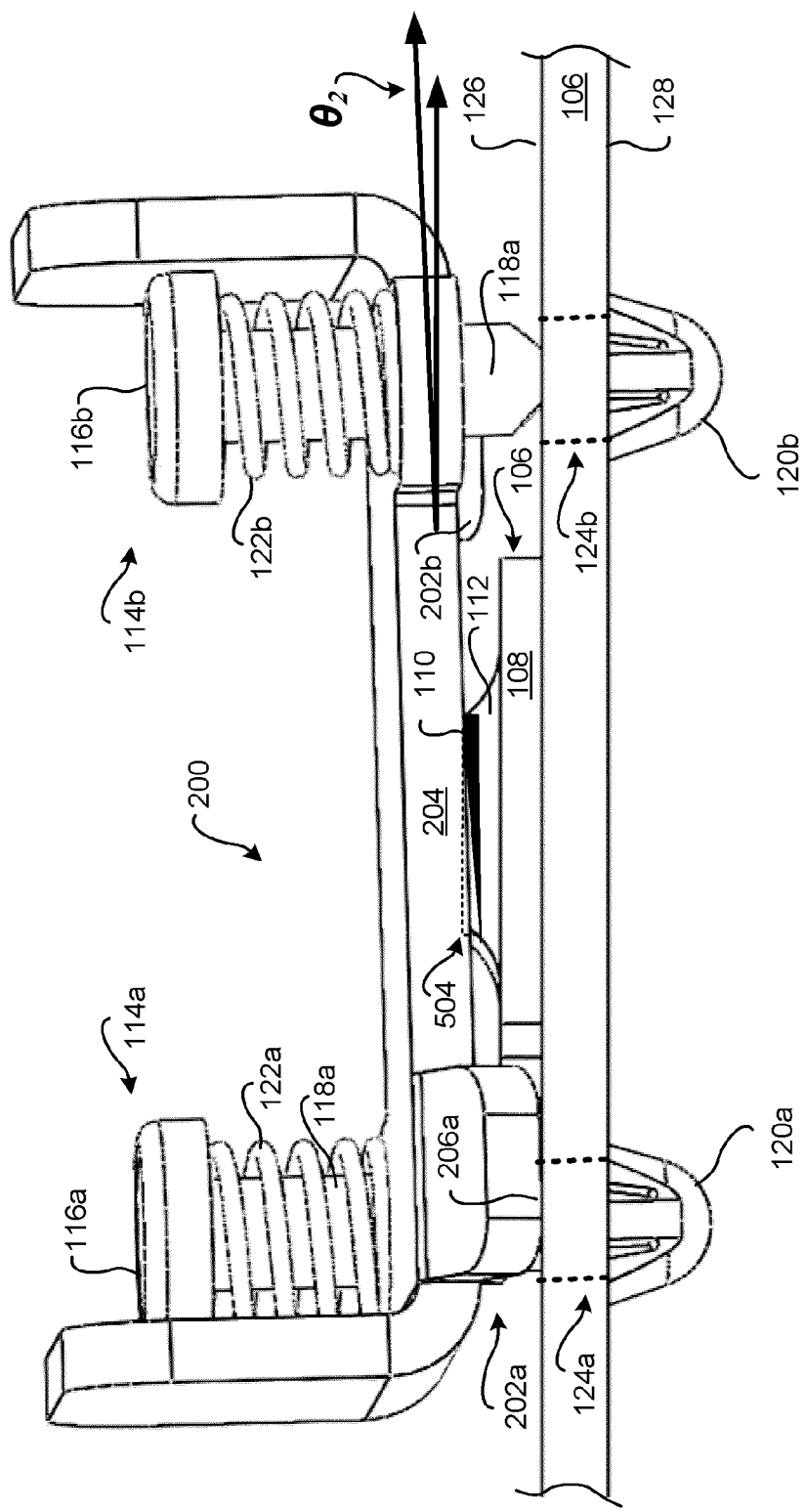
FIG. 6 is a perspective view of the a heat sink being affixed to the motherboard.

FIG. 6 is a perspective view of the exemplary heat sink 200 being affixed to the motherboard 106. FIG. 6 further illustrates that the heat sink 200 is not horizontally oriented with respect to the motherboard 106. Here, the heat sink 200 is oriented at an angle $\theta_2$ (illustrated as being approximately 5°) to the motherboard 106.

As illustrated in FIG. 6, the first push pin connector assembly 114a is being inserted through the corresponding motherboard bore 124a when a downward force is exerted on the head 116a such that retainer pin 118a passes through the bore 124a to that the lock tab structure 120a engages the bottom surface 128 of the motherboard 106. The coiled spring 122a is being compressed beyond its installed spring height so that the lock tab structure 120a passes just beyond the bottom surface 128 of the motherboard 106.

Here, the maximum angle $\theta_2$ (illustrated as being approximately 5°) of the heat sink 200 will be limited by the anti-rocking tab 202a when the lower leading edge 206a comes in contact with the top surface 126 of the motherboard 106 as the coiled spring 122a is being compressed beyond its installed spring height. Accordingly, the anti-rocking tab 202a limits the travel distance of the heat sink 200, thereby limiting the force and/or pressure exerted on an edge 106 of the die 110 of the flip chip 104.

FIG. 6 further illustrates that a second push pin connector assembly 114b is in the process of being pushed in a downward direction as a downward force is applied to the head 116b. The retainer pin 118b will pass through the bore 124b so that the lock tab structure 120b also engages the bottom surface 128 of the motherboard 106. Here, the coiled spring 122b is being further compressed beyond its installed spring height to its installation spring height so that the lock tab structure 120b can engage the bottom surface 128 of the motherboard 106. During this process, the lower leading edge 206b of a second anti-rocking tab 202a (partially visible behind the viewable push pin connector assembly 114b) will further limit the downward travel distance of the heat sink 200 as the second push pin connector assembly 114b is pushed beyond the bottom surface 128 to affix the heat sink 200 to the motherboard 106.

Figure 7A:
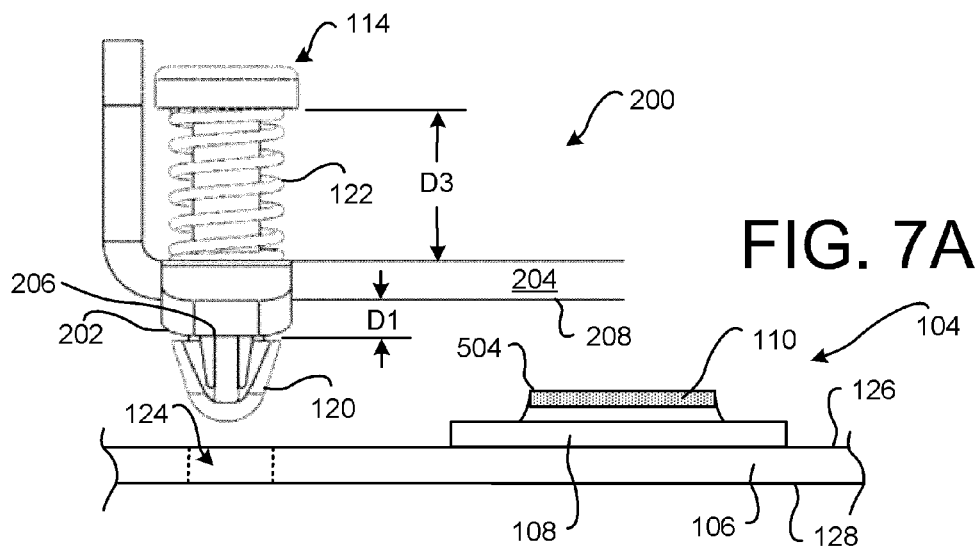
FIGS. 7A-7C are illustrations depicting insertion of a push pin connector assembly through a motherboard bore and limitation of the travel distance by an anti-rocking tab.
Figure 7B:
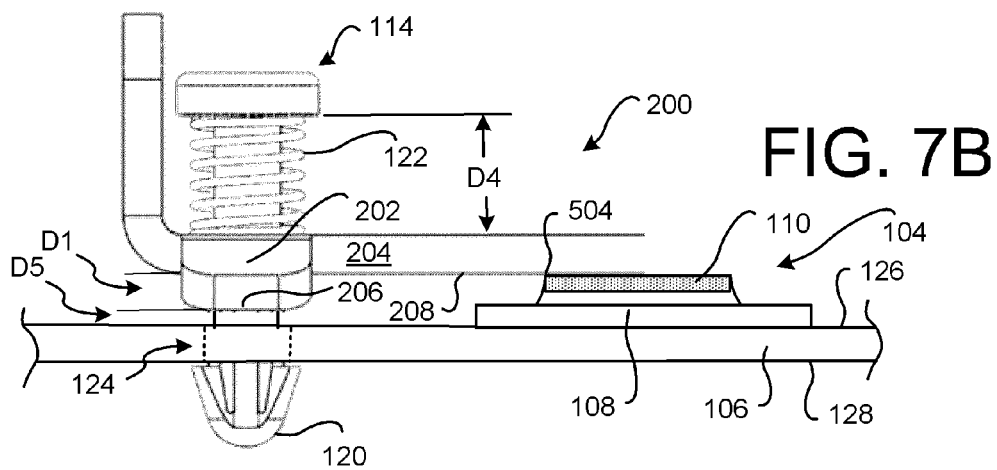
Figure 7C:
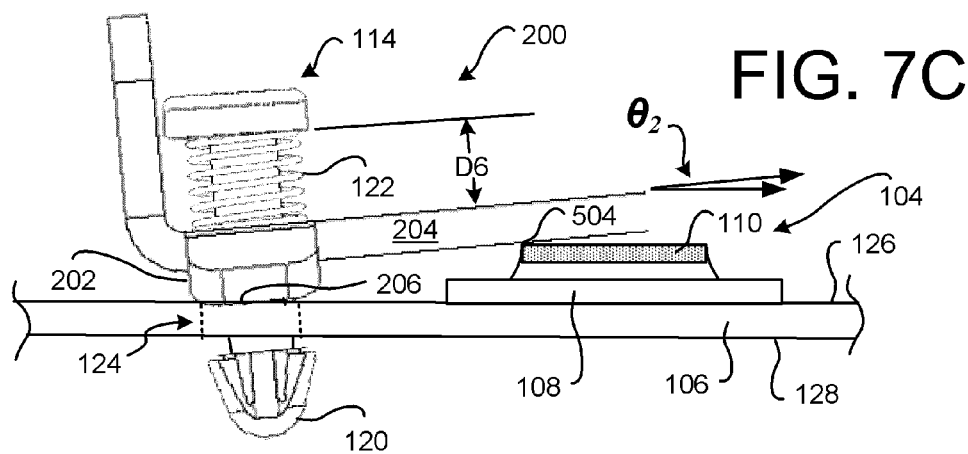

FIGS. 7A-7C are illustrations depicting insertion of a push pin connector assembly 114 through a motherboard bore 124 and limitation of the travel distance D6 by an anti-rocking tab 202. FIG. 7A illustrates the heat sink 200 with an anti-rocking tab 202 and a push pin connector assembly 114 oriented above the motherboard 106. The lock tab structure 120 is aligned with the bore 124 of the motherboard 106. The illustrated distance D1 corresponds to the length that the lower leading edge 206 is below the bottom surface 208 of the body portion 204.

The coil spring 122 is at its free static condition of minimum compression, as denoted by the free static distance D3. The free static condition of the coil spring 122 occurs when the lock tab structure 120 is engaged with the bottom surface 208 of the heat sink 200.

FIG. 7B illustrates the orientation of the heat sink 200 with respect to the die 110 of the flip chip 104 after the heat sink 200 has been affixed to the motherboard 106. Here, the bottom surface 208 of the heat sink is in thermal contact with the top of the die 110 of the flip chip 104. In this orientation, there is no substantial force and/or pressure exerted on the edge 504 of the die 110.

The coil spring 122 is now compressed to an installed condition, noted as the installed spring height D4. Since the coil spring 122 has been compressed to some extent (associated by the change in distance D3 to D4), the coil spring 122 is operable to force the heat sink 200 down onto the top of the die 110 so as to maintain thermal contact between the die 110 and the heat sink 200.

When the heat sink 200 is in the installed position so as to be above and in thermal contact with the top surface of the die 110, the leading lower edge 206 of the anti-rocking tab 202 is above the top surface 126 of the motherboard 106 by some amount, indicated by the distance D5. The distance D5 corresponds to a remaining amount of travel distance that the heat sink 200 will be able to travel during installation.

With respect to FIG. 1, One skilled in the art appreciate that the travel distance of a similarly configured legacy heat sink 102 (without anti-rocking tabs 202) is equal to the sum of the distances D1 and D5. Accordingly, the anti-rocking tab 202 has reduced travel distance by the amount of the distance D1. The remaining amount of travel distance D5 is configured to permit the lock tab structure 120 of the push pin connector assembly 114 to travel through the bore 124 of the motherboard 106 with a sufficient amount of clearance (room) to permit the lock tab structure 120 to engage the bottom surface 128 of the motherboard 106.

FIG. 7C illustrates a potential condition that may occur if the lock tab structure 120 of the push pin connector assembly 114 is pushed through the motherboard bore 124 at an angle. Here, the heat sink 200 is oriented at an angle $\theta_2$ (illustrated as being approximately 5°) to the motherboard 106. This angle $\theta_2$ is limited since the leading lower edge 206 of the anti-rocking tab 202 is now in contact with the top surface 218 of the motherboard 106. That is, the distance of further movement (travel distance) of the heat sink 200 is limited since the leading lower edge 206 of the anti-rocking tab 202 prevents further travel of the heat sink 200 towards the motherboard 106. (Here, one skilled in the art appreciates that the remaining amount of travel distance D5 illustrated in FIG. 7B has been traveled by the heat sink 200 during the example installation process of FIG. 7C.)

The coil spring 122 as illustrated in FIG. 7C is now further compressed (beyond the installed condition illustrated in FIG. 7B) to an installation condition, noted as the installation spring height D6. Since the coil spring 122 has been compressed to a greater extent (associated by the change in distance D3 to D6), the coil spring 122 is operable to exert a greater force and/or pressure on the edge 502 of the die 110.

However, since the leading lower edge 206 of the anti-rocking tab 202 limits further movement (that is, limits total travel distance to the distance D5), the exerted force and/or pressure on the edge 504 of the die 110 is not so large so as to cause crushing of the edge 504, cause crushing of a corner of the die 110, and/or cause cracks through the die 110 that might otherwise damage the die 110 and thereby render the die 110 inoperable. Without the presence of the anti-rocking tab 202, the additional travel distance of the heat sink 200 could become as much as the distance D1 (the length between the bottom surface 208 of the body portion 204 and the leading lower edge 206 of the anti-rocking tab 202).

In some embodiments, a relatively thin layer of a phase change material or a bonding pad material may be disposed between the area on the bottom surface 208 of the body portion 204 and the top surface of the die 110 of the flip chip 104. This phase change material or bonding pad material improves the thermal bonding between the heat sink 200 and the die 110 by eliminating or minimizing air gaps that might otherwise exist between the area on the bottom surface 208 of the body portion 204 and the top surface of the die 110. Further, such phase change materials or bonding pad materials may enhance the structural integrity of the die 110 and prevent vibratory motion of the area on the bottom surface 208 of the body portion 204 and the top surface of the die 110 during transportation and/or use. In some situations, the anti-rocking tab 202 may also limit movement of the heat sink 200 during use and/or during transportation.

It should be emphasized that the above-described embodiments of the heat sink 200 are merely possible examples of implementations of the invention. Many variations and modifications may be made to the above-described embodiments. All such modifications and variations are intended to be included herein within the scope of this disclosure and protected by the following claims.

The invention claimed is:

1. A heat sink that conducts heat away from a die of a flip chip residing on a motherboard, comprising:
   a body portion defined by a bottom surface, a top surface and an edge disposed between the top surface and the bottom surface,
      wherein the body portion has a first bore and a second bore,
      wherein the first bore and the second bore extend through the body portion,
      wherein the first bore and the second bore are configured to receive a fastener that affixes the heat sink to the motherboard, and
      wherein the body portion is in thermal contact with a top portion of the die of the flip chip when the body portion is affixed to the motherboard; and
   an anti-rocking tab extending outwardly and downwardly from the edge of the body portion,
      wherein the anti-rocking tab is defined by a leading lower edge that extends downward below the bottom surface of the body portion by a first distance (D1),
      wherein a second distance (D5) is defined by a distance below the leading lower edge of the anti-rocking tab and a top surface of the motherboard, and corresponds to a travel distance limit that the leading lower edge of the anti-rocking tab may travel during installation of the heat sink onto the mother board, and
      wherein after installation of the heat sink onto the mother board, the leading lower edge of the anti-rocking tab is suspended above the top surface of the motherboard by the second distance (D5) when the body portion of the heat sink is affixed to the motherboard.

2. The heat sink of claim 1, wherein during the installation of the heat sink to the motherboard, the travel distance limit that the edge of the body portion of the heat sink that is proximate to the anti-rocking tab can travel in a downward direction is limited by the second distance (D5) that the leading lower edge of the anti-rocking tab can travel before coming into contact with the top surface of the motherboard.

3. The heat sink of claim 2, wherein during the installation of the heat sink to the motherboard, the travel distance limit imposed by the leading lower edge of the anti-rocking tab limits a force that is applied to an edge of the die of the flip chip so that the edge of the die of the flip chip is not crushed or such that the die of the flip chip is not cracked.

4. The heat sink of claim 2, wherein during the installation of the heat sink to the motherboard, the travel distance limit imposed by the leading lower edge of the anti-rocking tab limits a pressure that is applied to an edge of the die of the flip chip so that the edge of the die of the flip chip is not crushed or such that the die of the flip chip is not cracked.

5. The heat sink of claim 1, wherein the fastener is a push pin connector assembly that comprises:
   a lock tab structure configured to extend through the first and second bores of the body portion of the heat sink and extend through a corresponding bore of the motherboard, wherein the lock tab structure is further configured to engage a bottom of the motherboard when inserted through the bore of the motherboard;
   a head upon which a downward force is applied to force the lock tab structure through the bore of the motherboard during installation of the heat sink onto the motherboard;
   a retainer pin between the head and the lock tab structure; and
   a coiled spring that is coiled about the retainer pin,
   wherein the coiled spring remains compressed to an installed spring height after the heat sink has been installed onto the motherboard, wherein the coiled spring exerts a force on the top of the body portion of the heat sink and the head of the push pin connector assembly thereby urging the body portion of the heat sink so that the bottom surface of the body portion of the heat sink remains in thermal contact with the top of the die of the flip chip.

6. The heat sink of claim 1,
   wherein the body portion of the heat sink is further defined by a first corner, a second corner, a third corner and a fourth corner,
   wherein the first bore is proximate to the first corner of the body portion,
   wherein the second bore is proximate to the second corner of the body portion, and wherein the second corner opposes the first corner,
   wherein the anti-rocking tab is a first anti-rocking tab that is proximate to the third corner of the body portion, wherein the third corner is between the first corner and the second corner, and wherein the fourth corner opposes the third corner, and
   wherein the heat sink further comprises:
      a second anti-rocking tab that is proximate to the third corner of the body portion,
         wherein the second anti-rocking tab extends outwardly and downwardly from an opposing edge of the body portion,
         wherein the second anti-rocking tab is defined by a leading lower edge that extends downward below the bottom surface of the body portion by the first distance (D1), and
         wherein the leading lower edge of the second anti-rocking tab is above the top surface of the motherboard by the second distance (D5) when the body portion is affixed to the motherboard.

7. The heat sink of claim 6,
   wherein during the installation of the heat sink to the motherboard, a first travel distance that the edge of the body portion of the heat sink that is proximate to the first anti-rocking tab can travel in a first downward direction is limited by the second distance (D5) that the leading lower edge of the first anti-rocking tab can travel, and
   wherein during the installation of the heat sink to the motherboard, a second travel distance that the opposing edge of the body portion of the heat sink that is proximate to the second anti-rocking tab can travel in a second downward direction is limited by the second distance (D5) that the leading lower edge of the second anti-rocking tab can travel.

8. The heat sink of claim 6,
   wherein during the installation of the heat sink to the motherboard, a travel distance limit imposed by the leading lower edge of the first anti-rocking tab and the second leading lower edge of the second anti-rocking tab limits a force that is applied to a corner of the die of the flip chip so that the corner of the die of the flip chip is not crushed or such that the die of the flip chip is not cracked.

9. A heat sink assembly that conducts heat away from a die of a flip chip residing on a motherboard, comprising:
   a body portion defined by a bottom surface, a top surface and an edge disposed between the top surface and the bottom surface, and defined by a first corner, a second corner, a third corner and a fourth corner,
   wherein the body portion has a first bore proximate to the first corner that extends through the body portion, and wherein the first bore is configured to receive a first fastener that affixes the heat sink to the motherboard,
   wherein the body portion has a second bore proximate to the first corner that extends through the body portion, wherein the second bore is configured to receive a second fastener that affixes the heat sink to the motherboard, and wherein the second corner opposes the first corner, and
   wherein the body portion is in thermal contact with a top portion of the die of the flip chip when the body portion is affixed to the motherboard,
   a first anti-rocking tab extending outwardly and downwardly from the edge of the body portion that is proximate to the third corner of the body portion,
   wherein the first anti-rocking tab is defined by a leading lower edge that extends downward below the bottom surface of the body portion by a first distance (D1),
   wherein a second distance (D5) is defined by a distance below the leading lower edge of the anti-rocking tab and a top surface of the motherboard, and corresponds to a travel distance limit that the leading lower edge of the anti-rocking tab may travel during installation of the heat sink onto the mother board, and
   wherein after installation of the heat sink onto the mother board, the leading lower edge of the anti-rocking tab is suspended above the top surface of the motherboard by the second distance (D5) when the body portion of the heat sink is affixed to the motherboard,
   a second anti-rocking tab extending outwardly and downwardly from an opposing edge of the body portion that is proximate to the fourth corner of the body portion, wherein the second anti-rocking tab is defined by a leading lower edge that extends downward below the bottom surface of the body portion by the first distance (D1), wherein the second distance (D5) is defined by a distance below the leading lower edge of the second anti-rocking tab and a top surface of the motherboard, and corresponds to a travel distance limit that the leading lower edge of the anti-rocking tab may travel during installation of the heat sink onto the mother board, and wherein the leading lower edge of the second anti-rocking tab is suspended above the top surface of the motherboard by the second distance (D5) when the body portion of the heat sink is affixed to the motherboard;

a first push pin connector assembly configured to extend through the first bore of the heat sink and extend through a corresponding first bore of the motherboard, wherein the first push pin connector assembly is further configured to engage a bottom of the motherboard when inserted through the first bore of the motherboard; and a second push pin connector assembly configured to extend through the second bore of the heat sink and extend through a corresponding second bore of the motherboard, wherein the second push pin connector assembly is further configured to engage the bottom of the motherboard when inserted through the second bore of the motherboard.

10. The heat sink assembly of claim 9, wherein the first push pin connector assembly comprises:

a lock tab structure configured to extend through the first bore of the heat sink and extend through the corresponding first bore of the motherboard, wherein the lock tab structure is further configured to engage the bottom of the motherboard when inserted through the first bore of the motherboard;

a head upon which a downward force is applied to force the lock tab structure through the first bore of the motherboard during installation of the heat sink onto the motherboard;

a retainer pin between the head and the lock tab structure; and a coiled spring that is coiled about the retainer pin, wherein the coiled spring remains compressed to an installed spring height after the heat sink has been installed onto the motherboard, wherein the coiled spring exerts a force on the top of the body portion of the heat sink and the head of the first push pin connector assembly thereby urging the body portion of the heat sink so that the bottom surface of the body portion of the heat sink remains in thermal contact with the top of the die of the flip chip.

11. The heat sink assembly of claim 9, wherein during an installation of the heat sink to the motherboard, a travel distance limit imposed by the leading lower edge of the first anti-rocking tab limits a force that is applied to a first edge of the die of the flip chip so that the first edge of the die of the flip chip is not crushed or such that the die of the flip chip is not cracked, wherein during the installation of the heat sink to the motherboard, the travel distance limit imposed by the leading lower edge of the second anti-rocking tab limits the force that is applied to a second edge of the die of the flip chip so that the second edge of the die of the flip chip is not crushed or such that the die of the flip chip is not cracked, and wherein the travel distance limit is equal to the second distance (D5).

12. The heat sink assembly of claim 9, wherein during an installation of the heat sink to the motherboard, a travel distance limit imposed by the leading lower edge of the first anti-rocking tab and the leading lower edge of the second anti-rocking tab limits a force that is applied to a corner of the die of the flip chip so that the corner of the die of the flip chip is not crushed or such that the die of the flip chip is not cracked.

13. A heat sink that conducts heat away from a die of a flip chip residing on a motherboard, comprising:

a body portion defined by a bottom surface, a top surface and an edge disposed between the top surface and the bottom surface, and defined by a first corner, a second corner, a third corner and a fourth corner, wherein the body portion has a first bore proximate to the first corner that extends through the body portion, and wherein the first bore is configured to receive a first fastener that affixes the heat sink to the motherboard, wherein the body portion has a second bore proximate to the first corner that extends through the body portion, wherein the second bore is configured to receive a second fastener that affixes the heat sink to the motherboard, and wherein the second corner opposes the first corner, and wherein the body portion is in thermal contact with a top portion of the die of the flip chip when the body portion is affixed to the motherboard;

a first anti-rocking tab extending outwardly and downwardly from the edge of the body portion that is proximate to the third corner of the body portion, wherein the first anti-rocking tab is defined by a leading lower edge that extends downward below the bottom surface of the body portion by a first distance (D1), wherein after installation of the heat sink onto the mother board, the leading lower edge of the first anti-rocking tab is suspended above a top surface of the motherboard by a second distance (D5) when the body portion is affixed to the motherboard, and wherein after installation of the heat sink onto the mother board, the leading lower edge of the first anti-rocking tab is not in contact with any electronic components affixed to the motherboard that are in proximity to the anti-rocking tab; and a second anti-rocking tab extending outwardly and downwardly from an opposing edge of the body portion that is proximate to the fourth corner of the body portion, wherein the second anti-rocking tab is defined by a leading lower edge that extends downward below the bottom surface of the body portion by the first distance (D1), and wherein after installation of the heat sink onto the mother board, the leading lower edge of the second anti-rocking tab is suspended above the top surface of the motherboard by the second distance (D5) when the body portion is affixed to the motherboard, and wherein after installation of the heat sink onto the mother board, the leading lower edge of the first anti-rocking tab is not in contact with any electronic components affixed to the motherboard that are in proximity to the anti-rocking tab.

14. The heat sink of claim 13,
wherein during an installation of the heat sink to the motherboard, a travel distance limit imposed by the leading lower edge of the first anti-rocking tab limits a force that is applied to a first edge of the die of the flip chip so that the first edge of the die of the flip chip is not crushed or such that the die of the flip chip is not cracked,
wherein during the installation of the heat sink to the motherboard, the travel distance limit imposed by the leading lower edge of the second anti-rocking tab limits the force that is applied to a second edge of the die of the flip chip so that the second edge of the die of the flip chip is not crushed or such that the die of the flip chip is not cracked, and
wherein the travel distance limit is equal to the second distance (D5).

15. The heat sink of claim 13,
wherein during an installation of the heat sink to the motherboard, a travel distance limit imposed by the leading lower edge of the first anti-rocking tab and the leading lower edge of the second anti-rocking tab limits a force that is applied to a corner of the die of the flip chip so that the corner of the die of the flip chip is not crushed or such that the die of the flip chip is not cracked.

16. The heat sink of claim 1,
wherein the body portion and the anti-rocking tab are fabricated from a flat sheet of metal material, and
wherein after the body portion and the anti-rocking tab are fabricated, the anti-rocking tab is bent downwardly to define the first distance D1.

17. The heat sink of claim 1,
wherein the profile defined by the edge of the body portion and the anti-rocking tab correspond to the shape of an extrusion die,
wherein the body portion and the anti-rocking tab are fabricated from a material that is extruded from the extrusion die, and
wherein after the body portion and the anti-rocking tab are fabricated, the anti-rocking tab is bent downwardly to define the first distance D1.

18. The heat sink of claim 1,
wherein a casting mold defines the body portion and the anti-rocking tab,
wherein the body portion and the anti-rocking tab are fabricated from a material that is cast into the casting mold, and
wherein after the body portion and the anti-rocking tab are released from the casting mold, the anti-rocking tab is bent downwardly to define the first distance D1.

19. The heat sink of claim 1,
wherein the anti-rocking tab is further defined by a third distance (D2) that extends the leading lower edge from the edge of the body portion by the third distance (D2) after the anti-rocking tab is bent downwardly to define the first distance D1, and
wherein the third distance (D2) extends the leading lower edge outwardly from the edge of the body portion such that the leading lower edge is not in contact with other electronic components in proximity to the anti-rocking tab.

20. The heat sink assembly of claim 9,
wherein the first anti-rocking tab and the second anti-rocking tab are further defined by a third distance (D2) that extends the leading lower edge from the edge of the body portion by the third distance (D2) after the first anti-rocking tab and the second anti-rocking tab are bent downwardly to define the first distance D1, and
wherein the third distance (D2) extends the leading lower edge of the first anti-rocking tab and the second anti-rocking tab outwardly from the edge of the body portion such that the leading lower edge is not in contact with the motherboard, the flip chip, and other electronic components in proximity to the anti-rocking tab.

* * * * *